US006707411B1

(12) United States Patent
Poulton et al.

(10) Patent No.: US 6,707,411 B1
(45) Date of Patent: Mar. 16, 2004

(54) ANALOG-TO-DIGITAL CONVERTER WITH ON-CHIP MEMORY

(75) Inventors: Kenneth D. Poulton, Palo Alto, CA (US); Thomas E. Kopley, La Honda, CA (US); Robert M. R. Neff, Palo Alto, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/284,890

(22) Filed: Oct. 30, 2002

(51) Int. Cl.[7] .............................................. H03M 3/00
(52) U.S. Cl. ........................................ 341/155; 341/123
(58) Field of Search ............................. 341/155; 11/123

(56) References Cited

U.S. PATENT DOCUMENTS

| | | |
|---|---|---|
| 4,455,613 A | 6/1984 | Shoemaker |
| 4,975,880 A | 12/1990 | Knierim et al. |
| 5,428,357 A | 6/1995 | Haab et al. |
| 6,166,673 A | 12/2000 | Odom |
| 6,297,760 B1 | 10/2001 | Hungerbuehler et al. |
| 6,614,373 B1 * | 9/2003 | Frazier ........................ 341/155 |

FOREIGN PATENT DOCUMENTS

EP    0 760 514    3/1997

* cited by examiner

Primary Examiner—Brian Young
(74) Attorney, Agent, or Firm—Ian Hardcastle

(57) ABSTRACT

The analog-to-digital conversion system comprises an analog-to-digital converter that includes a digital output, memory having a data input and a data output, an output port, an input data bus that extends from the digital output of the analog-to-digital converter to the data input of the memory and an output data bus that extends from the data output of the memory to the output port. The analog-to-digital converter is structured to generate digital samples at a sampling rate. The input data bus is structured to operate at the sampling rate of the ADC. At least one of the data output of the memory, the output data bus and the output port is structured to operate at a maximum rate less than the sampling rate.

25 Claims, 7 Drawing Sheets

ANALOG-TO-DIGITAL CONVERTER WITH ON-CHIP MEMORY

BACKGROUND OF THE INVENTION

High-speed analog-to-digital converters (ADCs) operate at extremely high sampling rates to generate digital samples. For example, an 8-bit, 10 GSa/sec ADC used in a high-speed conversion system generates digital samples at a data rate of 80 Gbit/sec. Conventional ADCs typically output digital samples at the rate at which the digital samples are generated, i.e., at a data rate of 80 Gbit/s in the above example. To output digital samples at such high data rates, conventional ADCs typically use either wide output busses, high-speed output busses or output busses that are both wide and high-speed to achieve the necessary data rate. ADCs with wide output busses require packages having a high pin count. This significantly increases the cost of the package and the complexity of designing a printed circuit to accommodate the package. ADCs with high-speed data busses require careful design to ensure the integrity of the data signals as the data signals pass from the ADC chip to the printed circuit board. This involves much care and effort in the design of the package and of the printed circuit board on which the package is mounted.

A typical approach to the design of a very high-speed data bus is to design the outputs of the integrated circuit (chip) in which the ADC is built to be as fast as possible. The maximum output speed attainable is influenced by such factors as the processing technology to be used to fabricate the chip and the availability of a custom package and special printed circuit board design. Once the maximum output speed has been determined, as many outputs are used as are necessary to obtain the required output data rate. This can lead to a design in which the chip has a large number of outputs and the package has a correspondingly large number of pins. This results in a large-area chip design housed in a large-area package that occupies a large area of the printed circuit board. The large number of maximum-speed outputs also increases the total power consumption and gives rise to the need to remove a corresponding large amount of heat from the package.

What is needed, therefore, is an analog-to-digital conversion system capable of sampling an analog input signal at a high sampling rate but that does not suffer from the shortcomings described above.

SUMMARY OF THE INVENTION

The invention provides an analog-to-digital conversion system that comprises an analog-to-digital converter that includes a digital output, memory having a data input and a data output, an output port, an input data bus that extends from the digital output of the analog-to-digital converter to the data input of the memory and an output data bus that extends from the data output of the memory to the output port. The analog-to-digital converter is structured to generate digital samples at a sampling rate. The input data bus is structured to operate at the sampling rate of the ADC. At least one of the data output of the memory, the output data bus and the output port is structured to operate at a maximum rate less than the sampling rate.

The invention also provides a method of digitally sampling an analog input signal. In the method, memory is provided, the analog input signal is digitally sampled at a sampling rate to generate digital samples and the digital samples are stored in the memory at the sampling rate. The digital samples are read out from the memory at a rate less than the sampling rate.

The invention allows the analog input signal to be sampled at a very high sampling rate without the need to output the resulting digital samples at the same high rate. Structures capable of outputting the digital samples at the rate at which the digital samples are read out from the memory can be substantially simpler and lower in cost than structures that output digital samples at the sampling rate.

DETAILED DESCRIPTION OF THE INVENTION

The invention provides an analog-to-digital conversion system that includes an analog-to-digital converter (ADC) and a memory integrated on the same chip. A chip-level input data bus that operates at the highest sampling rate supported by the ADC extends from the ADC to the memory. An output data bus that operates at an rate lower than the sampling rate extends from the output of the memory to an output port. The output port typically includes interconnections between the chip and the package and between the package and the printed circuit. The ADC generates digital samples at its sampling rate. The input data bus operates at the sampling rate of the ADC to convey the digital samples generated by the ADC to the memory. The memory stores the digital samples at the sampling rate. The digital samples stored in the memory are read out from the memory at a lower rate than the sampling rate. The output data bus delivers the digital samples read out from the memory to the output port at the rate at which the digital samples are read out from the memory. Since this rate is lower than the sampling rate, there is no need for very high-speed output circuits to be used, there is no need for the output data bus to be wide, fast or wide and fast, and there is no need to structure the output port to output a high data rate with good data signal integrity. Reading out the digital samples from the memory at a lower rate than the sampling rate also enables the digital samples to be easily received and processed by circuitry downstream of the output port. Such circuitry typically runs at slower speeds than the analog-to-digital conversion system.

Figure 1:
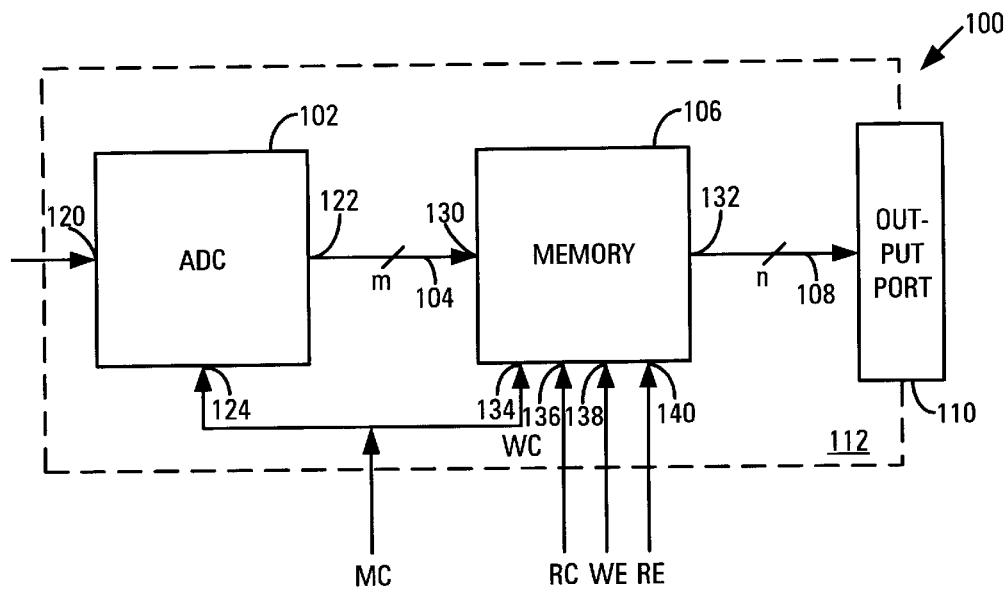
FIG. 1 is a block diagram of a first embodiment of an analog-to-digital conversion system according to the invention.

FIG. 1 is a block diagram of a first embodiment 100 of an analog-to-digital conversion system according to the invention. Analog-to-digital conversion system 100 is composed of an analog-to-digital converter 102, an input data bus 104, a memory 106, an output data bus 108 and an output port 110. The analog-to-digital converter, input data bus, memory, output data bus and part of the output port constitute at least part of a chip 112. The analog-to-digital converter has an analog input 120, a digital output 122 and a clock input 124. The memory has a data input 130, a data output 132, a write clock input 134, a read clock input 136, a write enable input 138 and a read enable input 140.

A master clock signal MC is connected to the clock input 124 of ADC 102 and to the write clock input 134 of memory 106. Although a direct connection is shown, the master clock signal may be connected to clock input 124 via an appropriate clock generator (not shown) that provides the ADC with one or more clock signals of the appropriate frequency. The sampling rate of the ADC is defined by the frequency of the master clock signal, but is not necessarily equal to the frequency of the master clock signal. Similarly, the master clock signal may be connected to write clock input 134 via an appropriate clock generator (not shown) that provides the memory with one or more clock signals of the appropriate frequency. Alternatively, the ADC can provide a clock signal for the memory.

Many different types of analog-to-digital converter suitable for use as analog-to-digital converter 102 are known in the art. Accordingly, ADC 102 will not be described in further detail. One specific example will be described below with reference to FIG. 5.

Input data bus 104 is composed of m conductors (not individually shown) and extends from the digital output 122 of ADC 102 to the data input 130 of memory 106. The conductors constituting the input data bus are short in length and extend directly across a surface of chip 112 from the digital output of the ADC to the data input of the memory. Accordingly, the input data bus is capable of operating at the highest sampling rate supported by the ADC.

Many different types of memory device suitable for use as memory 106 are known in the art. A conventional random-access memory (RAM) device, for example, may be used as memory 106. Different types of RAM provide different performance characteristics. For example, static RAM (SRAM) provides speed, dynamic RAM (DRAM) provides a high density, flash RAM provides non-volatility. Alternatively, a non random-access memory device may be used as memory 106. For example, a memory device such as a shift register, a First-In, First-Out (FIFO) memory, a Last-In, First-Out (LIFO) memory, or some other type of non random-access memory device may be used as memory 106. Again, different types of non random-access memory devices provide different performance characteristics.

The size of memory 106 determines the number of digital samples that can be stored. In some applications, the ability to store a the larger number of digital samples is advantageous. For example, events of longer duration can be sampled, or the sampling rate can be increased to provide a finer temporal resolution.

Memory 106 may be provided with a modular structure so that chips embodying analog-to-digital conversion systems incorporating different sizes of the memory can easily be made.

The data input 130 of memory 106 is connected to input data bus 104. Data output 132 is connected to output data bus 108. Write clock input 134 is connected to receive write clock signal WC. Read clock input 136 is connected to receive read clock signal RC. Write enable input 138 is connected to receive write enable signal WE. Read enable input 140 is connected to receive read enable signal RE.

In embodiments in which memory 106 is composed of a random-access memory device, the memory additionally includes an address generator (not shown). When the write enable signal WE is asserted, the address generator operates in response to the write clock signal WC to generate the addresses of the memory locations where the digital samples received at data input 130 are stored. When the read enable signal RE is asserted, the address generator operates in response to the read clock signal RC to generate the addresses of the memory locations from which the digital samples to be delivered to data output 132 are read out. Suitable address generators are known in the art and will therefore not be described here.

Embodiments in which the memory device used as memory 106 has a single clock input include gate circuitry (not shown) that operates in response to the write enable signal WE and the read enable signal RE to feed the appropriate one of the write clock and the read clock to the single clock input. Alternatively, a clock divider circuit whose output is connected to the single clock input may be activated by the read enable signal.

Output data bus 108 is composed of n conductors (not individually shown) and extends from the data output 132 of memory 106 to output port 110. In the example shown, the input data bus and the output data bus have equal numbers of conductors. In other examples, the busses may have different numbers of conductors. For example, in an embodiment in which Q samples are read out from the memory in parallel, the output data bus can be Q times wider than the input data bus. In an embodiment in which ADC conveys M digital samples to the memory in parallel, but in which the digital samples are read out singly from the memory, the output data bus is 1/M times the width of the input data bus.

Reading out the digital samples from memory 106 at a rate lower than the sampling rate of ADC 102 allows at least one of the data output 132 of the memory, the output data bus 108 and the output port 110 to be structured to be narrower and/or to operate at a maximum rate less than the sampling rate of the ADC. For example, the data output may incorporate relatively slow output circuits. Slow output circuits can reduce the chip area of chip 112 and reduce power consumption, for example. Output data bus 108 may be composed of relatively long, narrow conductors. Long, narrow conductors can make the layout of chip 112 more convenient and can reduce the chip area, for example. Output port 110 includes bonding pads (not shown) located on a surface of chip 112, pins of the package (not shown) in which the chip is mounted and interconnections, such as bonding wires, that extend from the bonding pads to respective ones of the pins. The term pin is used herein as a generic term to encompass pins and other structures that provide electrical connections, and, typically, additionally a mechanical connection, between a packaged integrated circuit and a printed circuit board.

The examples just described jointly or severally impose a limit on the maximum rate at which the digital samples output by memory 106 can be delivered to the pins of the package with acceptable data signal integrity. Accordingly, the frequency of the read clock signal RC is set such that rate at which the digital samples are read out from the memory and delivered to output port 110 by output data bus 108 is no more than the above-described maximum rate. The maximum rate is less than the sampling rate of ADC 102.

Moreover, the package in which chip 112 is mounted may be installed in a printed-circuit board (not shown) on which are additionally installed downstream circuits that receive the digital samples output by analog-to-digital conversion system 100. The maximum rate at which such downstream circuits are capable of receiving the digital samples may require that the digital samples be read out of the memory at a data rate less than the above-described maximum data rate.

Operation of analog-to-digital conversion system 100 will now be described. Analog-to-digital converter 102 receives an analog input signal via analog input 120. The analog-to-digital converter operates in response to the master clock signal MC received via clock input 124 to generate digital samples of the analog input signal at a sampling rate determined by the master clock signal. The analog-to-digital converter outputs the digital samples at digital output 122.

Input data bus 104 conveys the digital samples to data input 130 of memory 106. The memory receives write clock signal WC via write clock input 134 and read clock signal RC via read clock input 136. When write enable signal WE is enabled, the memory operates in response to write clock signal WC to store the digital samples received at data input 130. For example, the memory may store ones of the digital samples consecutively received at its data input in memory locations having consecutive addresses.

Storage of the digital samples received via input data bus 104 in memory 106 continues while the write enable signal WE is asserted. In one operational mode, storage of the digital samples stops when a desired number of samples, less than the sample capacity of the memory, has been stored in the memory or when the memory is full. In another operational mode, when the memory is full, the digital sample received next overwrites the oldest of the digital samples stored in the memory. In this operational mode, the memory always stores the J most recently received digital samples, where J is the sample capacity of the memory. This operational mode enables write enable signal WE to be asserted prior to the occurrence of an event that is to be sampled. Occurrence of the event can then be detected and the write enable signal de-asserted when the event is over. Provided that the temporal duration of the event is less than the time required to generate a number of digital samples equal to the sample capacity of the memory, a set of digital samples representing the event remains stored in the memory when the write enable signal is de-asserted.

After the digital samples representing an event have been stored in memory 106 and write enable signal WE has been de-asserted, read enable signal RE is asserted. Memory 106 now operates in response to read clock signal RC and outputs the digital samples stored therein at digital output 132. Output data bus 108 delivers the digital samples from data output 132 to output port 110. The rate at which the digital samples are output from memory 106 and, hence, from output port 110 depends on the frequency of read clock RC and is less than the sampling rate of ADC 102. The maximum rate at which the digital samples are read out of the memory is determined by factors such as the structure of the data outputs of the memory, the structure of output data bus 108 and the structure of output port 110, as described above. The rate at which the digital samples are read out may be further reduced to comply with the data rate requirements of downstream circuitry, also as described above.

The digital samples may be read out of memory 106 in the order in which the digital samples were stored in the memory. This minimizes the downstream processing required to analyze the event represented by the digital samples. Alternatively, the samples may be read out in a different order. For example, reading the digital samples out in a different order may be more convenient for the memory, and downstream circuitry may be more capable of re-ordering the digital samples.

Analog-to-digital converters that operate at sampling rates of about 10 GSa/s and above typically include multiple analog-to-digital converter modules. In an embodiment in which the analog-to-digital converter is composed of M analog-to-digital converter modules, each analog-to-digital converter module has a sampling rate of 1/M of the overall sampling rate of the ADC. The invention is easily applied to this ADC architecture: the memory includes a memory module corresponding to each ADC module. The memory module stores the digital samples generated by the ADC module. The digital samples stored in the memory as a whole are then read out at a rate slower than the sampling rate of the ADC. The digital samples read out from the memory are output from the analog-to-digital conversion system via the output data bus and the output port.

Figure 2:
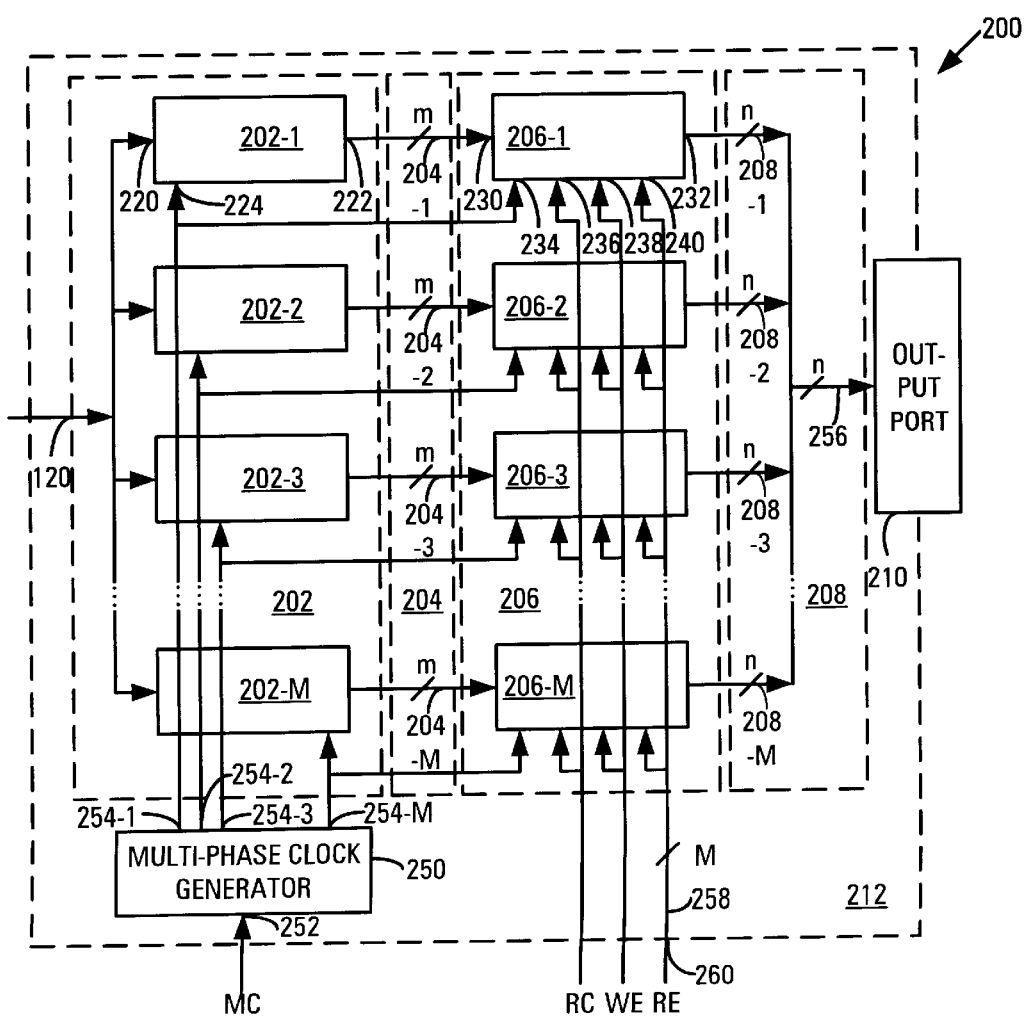
FIG. 2 is a block diagram of a second embodiment of an analog-to-digital conversion system according to the invention.

FIG. 2 is a block diagram of a second embodiment 200 of an analog-to-digital conversion system according to the invention in which analog-to-digital converter 202 is composed of M analog-to-digital converter modules 202-1 through 202-M, input data bus 204 is composed of M input sub-busses 204-1 through 204-M, memory 206 is composed of M memory modules 206-1 through 206-M, output data bus 208 is composed of M output sub-busses 208-1 through 208-M and output port sub-bus 256. Only analog-to-digital converters 202-1, 202-2, 202-3 and 202-M; input sub-busses 204-1, 204-2, 204-3 and 204-M, memory modules 206-1, 206-2, 206-3 and 206-M and output sub-busses 208-1, 208-2, 208-3 and 208-M are shown in FIG. 2 to simplify the drawing.

Analog-to-digital conversion system 200 is additionally composed of output port 210 and a multi-phase clock generator 250. The analog-to-digital converter, input data bus, memory, output data bus, multi-phase clock generator and part of the output port constitute at least part of a chip 212.

Analog-to-digital converter (ADC) module 202-1 has an analog input 220, a digital output 222 and a clock input 224. Analog-to-digital converter modules 202-2 through 202-M are similarly structured and will not be individually described. Reference numerals indicating the analog input, digital output and clock input of analog-to-digital converter modules 202-2, 202-3 and 202-M have been omitted from FIG. 2 to simplify the drawing. The analog inputs 220 of the ADC modules 202-1 through 202-M are connected in parallel to analog input 120.

Memory module 206-1 has a data input 230, a data output 232, a write clock input 234, a read clock input 236, a write enable input 238 and a read enable input 240. Memory modules 206-2 through 206-M are similarly structured and will not be individually described. Reference numerals indicating the data input, data output, write clock input, read clock input, write enable input and read enable input of memory modules 206-2, 206-3 and 206-M have been omitted from FIG. 2 to simplify the drawing.

Multi-phase clock generator 250 has a clock input 252 and M clock outputs 254-1 through 254-M of which only clock outputs 254-1, 254-2, 254-3 and 254-M are shown to simplify the drawing. Master clock signal MC is connected to clock input 252. Clock outputs 254-1 through 254-M are connected to the clock inputs 224 of ADC modules 202-1 through 202-M, respectively, and to the write clock inputs 234 of memory modules 206-1 through 206-M, respectively. The multi-phase clock generator generates a multi-phase clock signal having M phases that differ from one another by $2\pi n/M$ radians. Each phase has a frequency of 1/M the sampling frequency of the ADC. The multi-phase clock generator outputs the multi-phase clock signal at clock outputs 254-1 through 254-M.

In an embodiment in which the digital samples are read out of memory 206 in the temporal order in which they were stored, the read clock signal RC is a multi-phase clock signal similar to, but slower than, the multi-phase clock signal generated by multi-phase clock signal generator 250. Such a multi-phase read clock signal may be provided by additionally connecting the clock outputs 254-1 through 254-M of the multi-phase clock signal generator to the read clock inputs 236 of memory modules 206-1 through 206-M, respectively. Master clock signal MC is fed to the multi-phase clock signal generator via a clock signal divider (not shown) that is enabled by read enable signal RE when the digital samples are being read out from memory 206. The clock signal divider divides the frequency of the master clock signal, which causes the multi-phase clock generator to feed a slow multi-phase clock signal to the memory modules.

In another embodiment, multiple ones of the digital samples are read out from one of the memory modules before the digital samples are read out from another of the memory modules. The multiple ones of the digital samples read out can range from a subset to all of the digital samples stored in the memory module. In this embodiment, read clock signal RC is a single-phase signal that can be generated by additionally feeding the master clock signal MC to read clock inputs 236 of memory modules 206-1 through 206-M via an appropriate clock signal divider (not shown). The clock signal divider generates read clock signal RC with a frequency less than M times the frequency of the multi-phase clock signal fed to the write clock inputs 234.

Many different types of analog-to-digital converter modules suitable for use as analog-to-digital converter modules 202-1 through 202-M are known in the art. Accordingly, the ADC modules will not be described in further detail.

Input sub-busses 204-1 through 204-M are each composed of m conductors (not individually shown) and extend from the digital outputs 222 of ADC modules 202-1 through 202-M, respectively, to the data inputs 230 of memory modules 206-1 through 206-M, respectively. The conductors constituting the input sub-busses are short in length and extend-directly across a surface of chip 212 from the digital outputs 222 of ADC modules 202-1 through 202-M to the data inputs 230 of memory modules 206-1 through 206-M, respectively. Accordingly, the input sub-busses are capable of operating at the highest sampling rate supported by the ADC modules.

Many different types of memory device suitable for use as memory modules 206-1 through 206-M are known in the art. The alternatives and considerations for choosing among the alternatives are substantially the same as those described above with reference to memory 106.

In embodiments in which memory modules 206-1 through 206-M include a type of random-access memory, the memory modules additionally include an address generator (not shown). When the write enable signal WE is asserted, the address generator operates in response to the write clock signal WC to generate the addresses of the memory locations where the digital samples received at data input 230 are stored. When the read enable signal RE is asserted, the address generator operates in response to the read clock signal RC to generate the addresses of the memory locations from which the digital samples to be delivered to data output 232 are read out. Suitable address generators are known in the art and will therefore not be described here. Alternatively, memory 206 may include a single address generator. The addresses generated by the address generator are distributed to memory modules 206-1 through 206-M via an address distribution bus (not shown).

Embodiments in which the memory devices used as memory modules 206-1 through 206-M have a single clock input include gate circuitry (not shown) that operates in response to the write enable signal WE and the read enable signal RE to feed the appropriate one of the write clock and the read clock to the single clock input. Alternatively, a clock divider circuit whose input receives master clock signal MC and whose output is connected to the single clock input of the memory modules may be activated by the read enable signal.

Output sub-busses 208-1 through 208-M are each composed of n conductors (not individually shown) and extend from the data outputs 232 of memory modules 206-1 through 206-M, respectively, to output port 210. In the example shown, each of the input sub-busses and each of the output sub-busses have equal numbers of conductors. In other examples, the numbers of conductors in the busses may differ, as described above.

In the example shown, output data bus 208 is additionally composed of output port sub-bus 256 that extends to output port 210. Output sub-busses 208-1 through 208-M fan into the output port sub-bus. Read-enable bus 258 that connects the read enable inputs 238 of memory modules 206-1 through 206-M to read enable input 260 is an M-bit wide bus via which each of the memory modules receives an individual read enable signal. In this embodiment, the data outputs 232 of memory modules 206-1 through 206-M have a tri-state configuration, i.e., the data outputs have an OFF state except when the memory module's read enable signal is asserted. When the digital samples are read out of memory 206, the data outputs of all of the memory modules are set to the OFF state except for the data output of the memory module from which digital samples are being read.

In an alternative embodiment, the data outputs 232 of memory modules 206-1 through 206-M have a conventional two-state configuration, and read-enable bus 260 is a one-bit wide bus. The read enable bus connects the read enable inputs 240 of the memory modules in parallel to read-enable input 260. An M-input data selector (not shown) is interposed between output sub-busses 208-1 through 208-M and output port sub-bus 256. Assertion of the read enable signal sets all of the memory modules to read out the digital samples in parallel. The output sub-busses deliver the digital samples to the data selector. Only the digital samples read out from the memory module connected to the currently-active input of the data selector are output by the data selector and are delivered to output port 210 via the output port sub-bus.

In another embodiment, output data bus 208 includes more than one output port sub-bus (not shown). Sets of at least two of output sub-busses 208-1 through 208-M fan into each of the output port sub-busses. Each output port sub-bus extends to output port 210. In an example in which there are MNP output port sub-busses, P output sub-busses fan into each output port sub-bus, and output port 210 includes MJP times the number of pins than in the embodiments described above. In this embodiment, the digital samples may be read out from memory modules 206-1 through 206-M in any of the operational modes described above. Additionally, the digital samples may be read out in parallel from the memory modules connected to respective ones of the output port sub-busses.

In another embodiment, output data bus 208 lacks output port sub-bus 256 and output sub-busses 208-1 through 208-M extend directly from the data outputs 232 of memory modules 206-1 through 206-M, respectively, to output port 210. In this embodiment, output port 210 includes M times the number of pins than in the embodiments in which a single output port sub-bus extends to the output port. In this embodiment, the digital samples may be read out of the memory modules in any of the operational modes described above and may additionally be read out in parallel from all of the memory modules.

One or more of the data outputs 232 of memory modules 206-1 through 206-M, output sub-busses 208-1 through 208-M and output port sub-bus 256 constituting output data bus 208, and output port 210 is structured to operate at a maximum rate less than the sampling rate of ADC 202 in a manner similar to that described above. Digital samples are read out from memory 206 and are delivered to output port 210 at a rate no more than the maximum rate at which they can be delivered to the output pins that form part of the output port with acceptable data signal integrity. The rate at which the digital samples are read out from the memory and delivered to the output port may be further reduced by rate limitations imposed by a downstream circuit, also as described above.

Operation of analog-to-digital conversion system 200 will now be described. Each of the analog-to-digital converter modules 202-1 through 202-M receives the analog input signal via its analog input 220. Each analog-to-digital converter module operates in response to a phase of the multi-phase clock signal received via clock input 224 to generate digital samples of the analog input signal at a sampling rate of 1/M of the overall sampling rate of ADC 202. The phases of the multi-phase clock signal fed to the analog-to-digital converter modules differ by 2π/M radians. Consequently, the digital samples generated by ones of the analog-to-digital converter modules receiving adjacent phases of the multi-phase clock signal differ in time by a time corresponding to the phase difference. Each of the analog-to-digital converter modules outputs the digital samples at its digital output 222.

Input sub-busses 204-1 through 204-M convey the digital samples generated by the ADC modules 202-1 through 202-M, respectively, to the data inputs 230 of memory modules 206-1 through 206-M, respectively. Each memory module 206-1 through 206-M additionally receives a phase of the multi-phase clock signal generated by multi-phase clock generator 250 via write clock input 234. The memory modules additionally receive read clock signal RC via their read clock inputs 236. When write enable signal WE is enabled, the memory modules operate in response to the multi-phase clock signal to store the digital samples received at their data inputs 230. For example, each memory module may store ones of the digital samples consecutively received at its data input in memory locations having consecutive addresses.

Storage of the digital samples received via input sub-busses 204-1 through 204-M in memory modules 206-1 through 206-M, respectively, continues while write enable signal WE is asserted. As described above, in one operational mode, storage of the digital samples stops when a desired number of samples, less than the sample capacity of the memory, has been stored in memory 206, or when the memory is full and, in another operational mode, each memory module continuously stores the J most recently received digital samples, where J is the sample capacity of the memory module.

After the digital samples have been stored in memory 206 and write enable signal WE has been de-asserted, the digital samples can be read out of the memory. In one operational mode, the digital samples are read from the memory modules in the temporal order in which they were stored. In this operational mode, read clock signal RC is a multi-phase clock signal similar to, but slower than, the multi-phase clock signal generated by multi-phase clock signal generator 250. In another operational mode, multiple ones of the digital samples are read out from one of the memory modules before the digital samples are read out from another of the memory modules. In this case, the temporal order of the digital samples is restored, if needed, by circuitry (not shown) downstream of analog-to-digital conversion system 200. The multiple ones of the digital samples read out can range from a subset to all of the digital samples stored in the memory module.

Regardless of operational mode, memory modules 206-1 through 206-M operate in response to read enable signal RE and read clock signal RC to output the digital samples stored therein at data outputs 232. Output sub-busses 208-1 through 208-M and output port sub-bus 256 deliver the digital samples from the data outputs 232 of memory modules 206-1 through 206-M, respectively, to output port 210. The rate at which the digital samples are output by the memory modules depends on the frequency of the read clock signal RC. The rate at which the digital samples are received at output port 210 is less than the sampling rate of ADC 202. The factors that determine the maximum data rate at which samples are read out of memory 206 are described above. The data rate at which the digital samples are read out from memory 206 may be further reduced to comply with the data rate requirements of downstream circuitry, also as described above.

In the analog-to-digital conversion system according to the invention, the number of memory modules may be different from the number of ADCs or ADC modules. Examples of analog-to-digital conversion systems in which the number of memory modules exceeds or is less than the number of ADCs or ADC modules will be described next with reference to FIGS. 3 and 4.

Figure 3:
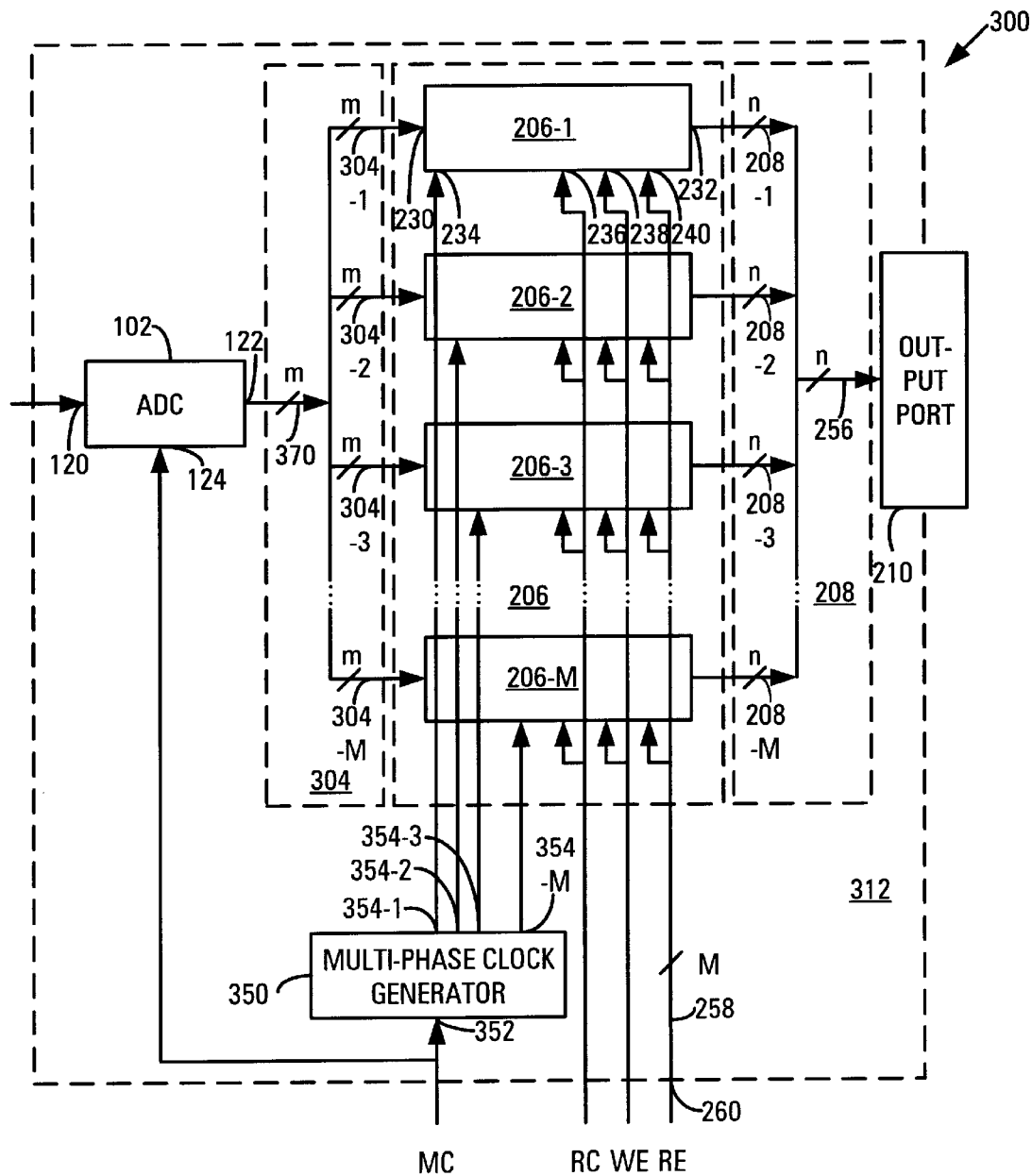
FIG. 3 is a block diagram of a third embodiment of an analog-to-digital conversion system according to the invention.

FIG. 3 is a block diagram of a third embodiment 300 of an analog-to-digital conversion system according to the invention in which the digital samples generated by a single analog-to-digital converter are stored in M memory modules (M>2). This arrangement allows each of the memory modules to store a subset of the digital samples generated by the ADC and therefore to operate at 1/M of the output data rate of the ADC. This allows slower memory devices to be used as the memory modules.

In analog-to-digital conversion system 300, input data bus 304 is composed of ADC sub-bus 370 and M input sub-busses 304-1 through 304-M, memory 206 is composed of M memory modules 206-1 through 206-M, output data bus 208 is composed of M output sub-busses 208-1 through 204-M and output port sub-bus 256. Only input sub-busses 304-1, 304-2, 304-3 and 304-M; memory modules 206-1, 206-2, 206-3 and 206-M and output sub-busses 208-1, 208-2, 208-3 and 204-M are shown in FIG. 3 to simplify the drawing.

Analog-to-digital conversion system 300 is additionally composed of analog-to-digital converter 102, output port 210 and a multi-phase clock generator 350. The analog-to-digital converter, input data bus, memory, output data bus, multi-phase clock generator and part of the output port constitute at least part of a chip 312. Elements of analog-to-digital conversion system 300 that correspond to elements of the analog-to-digital conversion systems described above with reference to FIGS. 1 and 2 are indicated using the same reference numerals and will not be described again in detail.

In input data bus 304, ADC sub-bus 370 extends from the digital output 122 of analog-to-digital converter 102 and fans out into M input sub-busses 304-1 through 304-M. Input sub-busses 304-1 through 304-M extend from ADC sub-bus 370 to the data inputs 230 of memory modules 206-1 through 206-M, respectively.

Multi-phase clock generator 350 has a clock input 352 and M clock outputs 354-1 through 354-M, of which only clock outputs 354-1, 354-2, 354-3 and 354-M are shown to simplify the drawing. A master clock signal MC is connected to clock input 352 and to the clock input 124 of ADC 102. Clock outputs 354-1 through 354-M are connected to the write clock inputs 234 of memory modules 206-1 through 206-M, respectively. The multi-phase clock generator generates a multi-phase clock signal having M phases that differ from one another by $2\pi/M$ radians. Each phase has a frequency of $1/M$ the sampling frequency of the ADC. The multi-phase clock generator outputs the multi-phase clock signal at clock outputs 354-1 through 354-M.

In a manner similar to that described above with reference to FIG. 2, memory modules 206-1 through 206-M additionally receive a read clock signal RC that may be a single-phase clock signal or a multi-phase clock signal, depending on the operational mode in which the digital samples are read out of memory 206.

ADC sub-bus 370 and input sub-busses 304-1 through 304-M are each composed of m conductors (not individually shown). The ADC sub-bus extends from the digital output 122 of ADC 102 and fans out into input sub-busses 304-1 through 304-M that extend to the data inputs 230 of memory modules 206-1 through 206-M, respectively. The conductors constituting the ADC sub-bus and the input sub-busses are short in length and extend directly across a surface of chip 312 from the digital output 122 of ADC 102 to the data inputs 230 of memory modules 206-1 through 206-M. Accordingly, the ADC sub-bus and the input sub-busses are capable of operating at the highest sampling rate supported by the ADC modules.

Many different types of memory device suitable for use as memory modules 206-1 through 206-M are known in the art. The alternatives and considerations for choosing among the alternatives are substantially the same as those described above with reference to memory 106 in FIG. 1. For a given sampling rate of ADC 102, memory 206 may incorporate slower memory devices than memory 106.

Operation of analog-to-digital conversion system 300 will now be described. Analog-to-digital converter 102 receives the analog input signal via analog input 120. The analog-to-digital converter operates in response to the master clock signal MC received via clock input 124 to generate digital samples of the analog input signal at a sampling rate determined by the frequency of the master clock signal. The analog-to-digital converter outputs the digital samples at digital output 122.

ADC sub-bus 370 and input sub-busses 304-1 through 304-M convey the digital samples generated by ADC 102 to the data inputs 230 of memory modules 206-1 through 206-M, respectively. The memory modules 206-1 through 206-M additionally receive the multi-phase clock signal generated by multi-phase clock generator 350 via their write clock inputs 234. Adjacent phases of the multi-phase clock differ in time by a time equal to the sampling period of ADC 102. The memory modules additionally receive the read clock signal RC via their read clock inputs 236. When write enable signal WE is enabled, the multi-phase clock signal fed to the write clock inputs 234 of memory modules 206-1 through 206-M causes each of the M digital samples consecutively generated by the ADC to be stored in a different one of the memory modules. For example, digital sample numbers 1, M+1, 2M+1, . . . are stored in memory module 206-1, whereas digital sample numbers 2, M+2, 2M+2, . . . are stored in memory module 206-2. For example, each memory may store ones of the digital samples that are successively stored coincident with the clock signal received at write clock input 234 in memory locations having consecutive addresses.

Storage of the digital samples received via input sub-busses 304-1 through 304-M in memory modules 206-1 through 206-M, respectively, continues while the write enable signal WE is asserted. As described above, in one operational mode, storage of the digital samples stops when a desired number of samples, less than the sample capacity of the memory, has been stored in memory 206, or when the memory is full and, in another operational mode, each memory module stores the J most recently stored digital samples, where J is the sample capacity of the memory module.

After the digital samples have been stored in memory modules 206-1 through 206-M and write enable signal WE has been de-asserted, the digital samples are read out of the memory modules in a manner similar to that described above with reference to FIG. 2. The rate at which the digital samples are read out from the memory modules and delivered to the output port depends on the frequency of the read clock RC. This rate is less than the sampling rate of ADC 102 and the rate at which memory 206 received the digital samples via input data bus 204. The maximum data rate at which samples are read out from memory 206 is determined by the factors described above.

Figure 4:
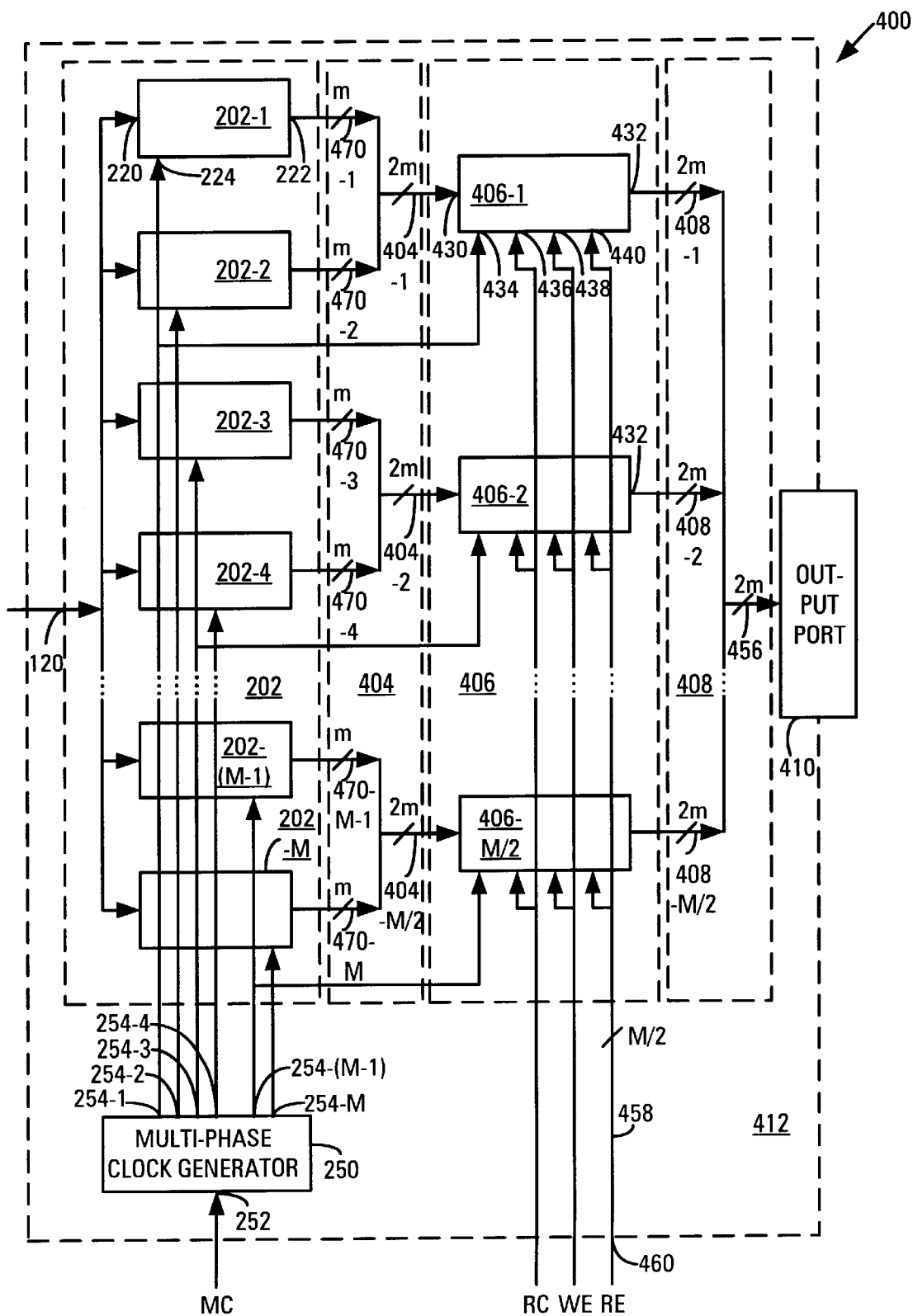
FIG. 4 is a block diagram of a fourth embodiment of an analog-to-digital conversion system according to the invention.

FIG. 4 is a block diagram of a fourth embodiment 400 of an analog-to-digital conversion system according to the invention in which the analog-to-digital converter modules constituting analog-to-digital converter 202 each generate m-bit digital samples and the memory modules constituting memory 406 store pairs of the digital samples as 2 m-bit words. The memory modules are fewer in number than the analog-to-digital converter modules.

In analog-to-digital conversion system 400, analog-to-digital converter 202 is composed of M analog-to-digital converter modules 202-1 through 202-M, input data bus 404 is composed of M ADC sub-busses 470-1 through 470-M and M/2 input sub-busses 404-1 through 404-M/2, memory 406 is composed of M/2 memory modules 406-1 through 406-M/2, and output data bus 408 is composed of M/2 output sub-busses 4081 through 408-M/2 and output port sub-bus 456. Only analog-to-digital converter modules 202-1, 202-2, 202-3, 202-4, 202-(M-1) and 202-M; ADC sub-busses 470-1, 470-2, 470-3, 470-4, 470-(M-1) and 470-M; memory modules 406-1, 406-2 and 406-M/2 and output sub-busses 4081, 4082 and 404-M/2 are shown in FIG. 4 to simplify the drawing.

Analog-to-digital conversion system 400 is additionally composed of output port 410 and a multi-phase clock generator 250. The analog-to-digital converter, input data bus, memory, output data bus, multi-phase clock generator and part of the output port constitute at least part of a chip 412. Elements of analog-to-digital conversion system 400 that correspond to elements of the analog-to-digital conversion systems described above with reference to FIGS. 1 and 2 are indicated using the same reference numerals and will not be described again in detail.

Memory module 406-1 has a data input 430, a data output 432, a write clock input 434, a read clock input 436, a write enable input 438 and a read enable input 440. Memory modules 406-2 through 406-M/2are similarly structured and will not be individually described. Reference numerals indicating the data input, data output, write clock input, read clock input, write enable input and read enable input of memory modules 406-2 through 406-M/2have been omitted from FIG. 4 to simplify the drawing.

Clock outputs 254-1 through 254-M of multi-phase clock generator 250, of which only clock outputs 254-1, 254-2, 254-3, 254-3, 254-4, 254-(M-1) and 254-M are shown to simplify the drawing, are connected to the clock inputs 224 of ADC modules 202-1 through 202-M, respectively. Odd numbered ones of clock outputs 254-1 through 254-M are additionally connected to the write clock inputs 434 of memory modules 406-1 through 406-M/2, respectively. Alternatively, one of the ADCs connected to each of the memory modules may provide a write clock signal to the memory module.

In a manner similar to that described above with reference to FIG. 2, memory modules 406-1 through 406-M/2 additionally receive a read clock signal RC. The read clock signal is a single-phase clock signal or a multi-phase clock signal, depending on the operational mode by which the digital samples are read out from memory 406, as described above.

ADC sub-busses 470-1 through 470-M are each composed of m conductors (not individually shown) and extend from the digital outputs 222 of ADC modules 202-1 through 202-M, respectively. Pairs of adjacent ones of ADC sub-busses 470-1 through 470-M combine into input sub-busses 404-1 through 404-M/2, respectively, that extend to the data inputs 430 of memory modules 406-1 through 406-M/2, respectively. For example, pairs of adjacent ones 470-1 and 470-2, 470-3 and 470-4, 470-(M-1) and 470-M of the ADC sub-busses combine into input sub-busses 404-1, 404-2 and 404-M/2, respectively. In the example shown, the input sub-busses are each twice as wide as the ADC sub-busses, i.e., the input sub-busses are composed of 2 m conductors. In general, the input sub-busses are x times as wide as the ADC sub-busses, where x is the number of ADC sub-busses that combine into each input sub-bus.

The conductors constituting ADC sub-busses 470-1 through 470-M and input sub-busses 404-1 through 404-M/2 are short in length and extend directly across a surface of chip 412 from the digital outputs 222 of ADC modules 202-1 through 202-M, respectively, to the data inputs 430 of memory modules 406-1 through 406-M/2, respectively. Accordingly, the ADC sub-busses and the input sub-busses are capable of operating at the highest sampling rate supported by the ADC modules.

Many different types of memory devices suitable for use as memory modules 406-1 through 406-M/2 are known in the art. The alternatives and considerations for choosing among the alternatives are substantially the same as those described above with reference to memory 206.

Read-enable bus 458 that connects the read enable inputs 438 of memory modules 406-1 through 406-M/2 to read enable input 460 is an M/2-bit wide bus through which each of the memory modules receives an individual read enable signal. In this embodiment, the data outputs 432 of memory modules 406-1 through 406-M/2 have a tri-state configuration, as described above.

Output data bus 408 is composed of output sub-busses 408-1 through 408-M/2 and output port sub-bus 456. The output sub-busses and the output port sub-bus are each composed of 2 m conductors (not individually shown). Output sub-busses 408-1. through 408-M/2 extend from the data outputs 432 of memory modules 406-1 through 406-M/2, respectively, and fan into output port sub-bus 456. Output data bus 408 may have alternative configurations similar to those described above with reference to output data bus 208.

One or more of the data outputs 432 of memory modules 406-1 through 406-M/2, output sub-busses 408-1 through 408-M/2and output port sub-bus 456 constituting output data bus 408, and output port 410 is structured to operate at a maximum rate less than the sampling rate of ADC 202, in a manner similar to that described above. Digital samples are read out of memory 406 and delivered to output port 410 at a rate no more than the maximum rate at which they can be delivered to the output pins that form part of the output port with acceptable data signal integrity. The rate at which the digital samples are read out of the memory and delivered to the output port may be further reduced by rate limitations imposed by a downstream circuit, also as described above.

Operation of analog-to-digital conversion system 400 will now be described. Each of the analog-to-digital converter modules 202-1 through 202-M receives the analog input signal via its analog input 220. Each analog-to-digital converter module operates in response to a phase of the multi-phase clock signal received via clock input 224 to generate digital samples of the analog input signal at a sampling rate of 1/M of the overall sampling rate of ADC 202. The phases of the multi-phase clock signal fed to the analog-to-digital converter modules differ by $2\pi/M$ radians. Consequently, the digital samples generated by ones of the analog-to-digital converter modules receiving adjacent phases of the multi-phase clock signal differ in time by a time corresponding to the phase difference. Each analog-to-digital converter module outputs the digital samples at its digital output 222.

ADC sub-busses 470-1 through 470-M receive the m-bit digital samples generated by ADC modules 202-1 through 202-M, respectively. Adjacent pairs of the ADC sub-busses combine to form input sub-busses 404-1 through 404-M/2 that convey $2\pi$-bit sample pairs to the 2 m-bit data inputs 430 of memory modules 406-1 through 406-M/2, respectively. Each of the memory modules 406-1 through 406-M/2 additionally receives a different phase of the multi-phase clock signal from multi-phase clock generator 250 via its write clock input 434. The memory modules additionally receive the read clock signal RC via their read clock inputs 436.

When write enable signal WE is enabled, memory modules 406-1 through 406-M/2 operate in response to the respective phase of write clock signal WC to write the pair of digital samples present at the data input 430 into the memory module. For example, each memory module may store pairs of the digital samples consecutively received at its data input in memory locations having consecutive addresses.

Storage of the pairs of digital samples received via input sub-busses 404-1 through 404-M/2in memory modules 406-1 through 406-M/2, respectively, continues while the write enable signal WE is asserted. In a manner similar to that described above, in one operational mode, storage of the pairs of digital samples stops when a desired number of sample pairs, less than the sample pair capacity of the memory, has been stored in memory 406, or the memory is full and, in another operational mode, each memory module continuously stores the K most recently received pairs of digital samples, where K is the sample pair capacity of the memory module.

After the pairs of digital samples have been stored in memory 406 and write enable signal WE has been de-asserted, the pairs of digital samples can be read out of the memory. In one operational mode, the pairs of digital samples are read from the memory in the temporal order in which they were stored in a manner similar to that described above for reading out single digital samples. In another operational mode, multiple ones of the pairs of digital samples are read out from one of the memory modules before pairs of digital samples are read out from another of the memory modules in a manner similar to that described above for reading out single digital samples. The multiple ones of the pairs of digital samples read out can range from a subset to all of the pairs of digital samples stored in the memory module. In the latter case, the temporal order of the digital samples can be restored if needed by circuitry (not shown) downstream of analog-to-digital conversion system 400.

Regardless of operational mode, memory modules 406-1 through 406-M/2 operate in response to the read enable signal RE and the read clock signal RC and output the pairs of digital samples stored therein at their data outputs 432. Output sub-busses 408-1 through 408-M/2 and output port sub-bus 456 deliver the pairs of digital samples from the data outputs 432 of memory modules 406-1 through 406-M/2, respectively, to output port 410. The data rate at which the pairs of digital samples are output by the memory modules depends on the frequency of the read clock RC. The rate at which the pairs of digital samples are delivered to output port 410 is less than the rate at which the pairs of digital samples were conveyed to memory 406 via input data bus 404. The maximum rate at which samples are read out of the memory and delivered to the output port is determined by factors such as the structure of the data outputs of the memory modules, the structure of the output sub-busses and the output port sub-bus and the structure of the output port, as described above. The rate at which the digital samples are read out from memory 406 may be further reduced to comply with the data rate requirements of downstream circuitry, also as described above.

In the above-described example, ADC sub-busses 470-1 through 470-M extending from pairs of the ADC modules 202-1 through 202-M, respectively, combine into each double-width input sub-bus 404-1 through 404-M/2 that extends to the data input of a respective one of memory modules 406-1 through 406-M/2, respectively. More generally, ADC 202 may be composed of M=P×Q ADC modules 202-1 through 202-M, and the ADC sub-busses extending from sets of Q of the ADC modules may combine into each of the input sub-busses that extends to the data input of one of the memory modules. In this case, there are P input sub-busses and P memory modules and the width of the input sub-busses is Q times that of the ADC sub-busses.

Figure 5:
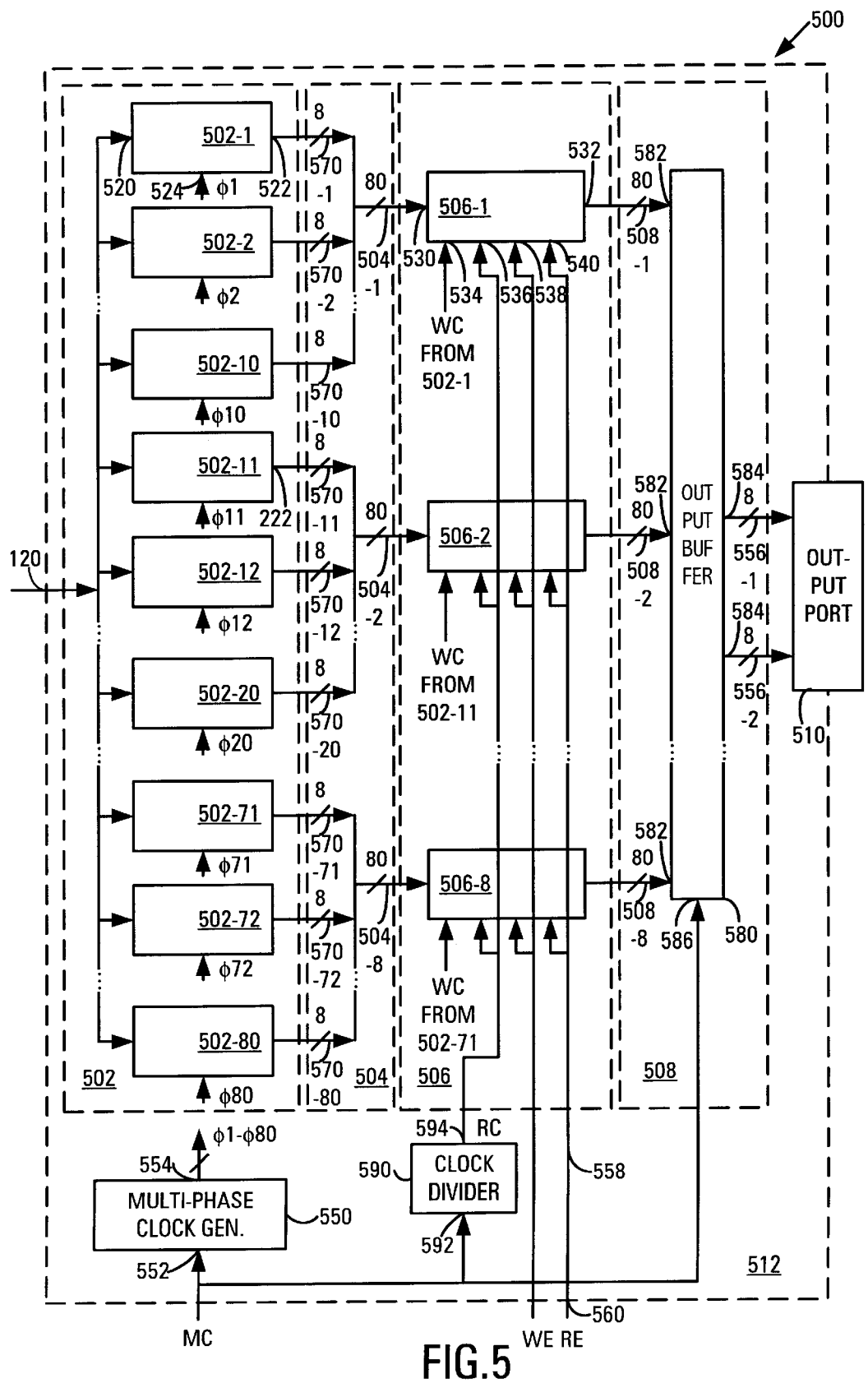
FIG. 5 is a block diagram of a fifth embodiment of an analog-to-digital conversion system according to the invention.

FIG. 5 is a block diagram of an example of a fifth embodiment 500 of an analog-to-digital conversion system according to the invention. The fifth embodiment is a practical example of a 20 GSa/s analog-to-digital conversion system in which 16 pins of the package in which the chip embodying the system is mounted are allocated to the output port. With 16 pins available, the output port can simultaneously output two digital samples in parallel. The numbers of the various modules and sub-busses, the widths of the various sub-busses, the number of output pins and the frequencies described below are merely exemplary and the fifth embodiment may be constructed with values different from those exemplified.

In analog-to-digital conversion system 500, analog-to-digital converter 502 is composed of 80 (M=80) analog-to-digital converter modules 502-1 . . . 502-80; input data bus 504 is composed of 80 ADC sub-busses 570-1 . . . 570-80 and eight (M/10) input sub-busses 504-1 . . . 504-8; memory 506 is composed of eight (M/10) memory modules 506-1 through 506-8 and output data bus 508 is composed of eight output sub-busses 508-1 through 508-8, an output buffer 580, and two output port sub-busses 556-1 and 556-2. Only analog-to-digital converter modules 502-1, 502-2, 502-10, 502-11, 502-12, 502-20, 502-71, 502-72 and 502-80; ADC sub-busses 570-1, 570-2, 570-10, 570-11, 570-12, 570-20, 570-71, 570-72 and 570-80; input sub-busses 504-1, 504-2 and 504-8; memory modules 506-1, 506-2 and 506-8 and output sub-busses 508-1, 508-2 and 504-8 are shown in FIG. 5 to simplify the drawing.

Analog-to-digital conversion system 500 is additionally composed of output port 510, multi-phase clock generator 550 and clock divider 590. Analog-to-digital converter 502, input data bus 504, memory 506, output data bus 508, the multi-phase clock generator, the clock divider and part of the output port constitute at least part of a chip 512. Elements of analog-to-digital conversion system 500 that correspond to elements of the analog-to-digital conversion systems described above with reference to FIGS. 1, 2 and 4 are indicated using the same reference numerals and will not be described again in detail.

Analog-to-digital converter (ADC) module 502-1 has an analog input 520, a digital output 522 and a clock input 524. Analog-to-digital converter modules 502-2 through 502-80 are similarly structured and will not be individually described. Reference numerals indicating the analog input, digital output and clock input of the remaining analog-to-digital converter modules shown in FIG. 5 have been omitted to simplify the drawing. Connections from multi-phase clock signal generator 550 to the clock inputs 524 of the ADC modules have also been omitted to simplify the drawing. However, the phases of the multi-phase clock signals connected to the ADC modules shown are shown. The analog inputs 520 of ADC modules 502-1 through 502-80 are connected in parallel to analog input 120.

Memory module 506-1 has a data input 530, a data output 532, a write clock input 534, a read clock input 536, a write enable input 538 and a read enable input 540. Memory modules 506-2 through 506-8 are similarly structured and will not be individually described. Reference numerals indicating the data input, data output, write clock input, read clock input, write enable input and read enable input of memory modules 506-2 and 506-8 have been omitted from FIG. 5 to simplify the drawing. Write clock signal connections from the ADC modules to the clock inputs 534 of memory modules 506-1, 506-2 and 506-8 have also been omitted to simplify the drawing.

Multi-phase clock generator 550 has a clock input 552 and 80 multi-phase clock outputs 554. A 250 MHz master clock signal MC is connected to clock input 552. The multi-phase clock outputs are connected to the clock inputs 524 of the ADC modules 502-1 through 502-80. The multi-phase clock generator generates a multi-phase clock signal having 80 phases φ1 through φ80 that differ from one another by 2π/80 radians. The sampling frequency of the ADC is 80 times the frequency of the phases of the multi-phase clock signal, i.e., 250×80=20 GHz. The multi-phase clock generator outputs the multi-phase clock signal at clock output 554.

Memory modules 506-1, 506-2, ..., 506-8 each receive a 250 MHz write clock signal WC from the ADC modules 502-1, 502-11, ..., 502-71, respectively, at their write clock inputs 534 and additionally receive read clock signal RC from the output of clock divider 582 at their read clock inputs 536. Read clock signal RC is a single-phase clock signal as the digital samples are read out of the memory modules in parallel, as will be described further below.

ADC sub-busses 570-1 through 570-80 are each composed of 8 conductors (not individually shown) and extend from the digital outputs 522 of ADC modules 502-1 through 502-80, respectively. Sets of ten adjacent ones of the ADC sub-busses 570-1 through 570-80 each combine into a respective one of the input sub-busses 504-1 through 504-8, respectively, that extend to the data inputs 530 of memory modules 506-1 through 506-8, respectively. For example, sets of ten adjacent ones 570-1 through 570-10, 570-11 through 527-20 and 570-71 through 570-80 of the ADC sub-busses combine into input sub-busses 504-1, 504-2 and 504-8, respectively. In the example shown, the input sub-busses are each ten times as wide as the ADC sub-busses, i.e., the input sub-busses are each composed of 80 conductors.

The conductors constituting ADC sub-busses 570-1 through 570-80 and input sub-busses 504-1 through 504-8 are short in length and extend directly across a surface of chip 512 from the digital outputs 522 of ADC modules 502-1 through 502-80, respectively, to the data inputs 530 of memory modules 506-1 through 506-8, respectively. Accordingly, the ADC sub-busses and the input sub-busses are capable of operating at the highest sampling rate supported by the ADC modules.

Many different types of memory devices suitable for use as memory modules 506-1 through 506-8 are known in the art. The alternatives and considerations for choosing among the alternatives are substantially the same as those described above with reference to memory 106.

Read-enable bus 558 that connects the read enable inputs 538 of memory modules 506-1 through 506-8 to read enable input 560 is a 1-bit wide bus through which the memory modules receive an common read enable signal. In this embodiment, the data outputs 532 of memory modules 506-1 through 506-8 have a two-state configuration, as described above.

Output data bus 508 is composed of output sub-busses 508-1 through 508-8, output buffer 580 and two output port sub-busses 556-1 and 556-2. The output sub-busses are each composed of 80 conductors (not individually shown). Output sub-busses 508-1 through 508-8 extend from the data outputs 532 of memory modules 506-1 through 506-8, respectively, to the data inputs 582 of the output buffer. Output port sub-busses 556-1 and 556-2 extend from the data outputs 584 of the data buffer to output port 510.

Output buffer 580 additionally receives master clock signal MC at its clock input 586. The master clock signal is additionally connected to the clock input 592 of clock divider 590. The clock output 594 of the clock divider is connected to the read clock inputs 536 of memory modules 506-1 through 506-8 in parallel. The output buffer is structured to re-arrange the sets of 80 digital samples it receives in parallel at its sample inputs into pairs of digital samples. The output buffer outputs the pairs of digital samples at its sample outputs at 40 times the rate at which it receives the sets of 80 digital samples. The output buffer may be structured to perform sample processing more complex than the simple re-arranging and rate conversion just described.

Clock divider 590 is structured to divide master clock signal MC by 40 to generate read clock RC. Master clock signal MC has a frequency of 250 Miz, so the read clock has a frequency of 6.25 MHz.

One or more of the data outputs 532 of memory modules 506-1 through 506-8, output sub-busses 508-1 through 508-8 and output port sub-busses 556-1 and 556-2 constituting output data bus 508, and output port 510 is structured to operate at a maximum rate less than the sampling rate of ADC 502 in a manner similar to that described above. Digital samples are read out from memory 506 and are delivered to output port 510 at a rate no more than the maximum rate at which they can be delivered to the output pins that form part of the output port with acceptable data signal integrity. The rate at which the digital samples are read out of the memory and delivered to the output port may be further reduced by rate limitations imposed by a downstream circuit, also as described above. In the example shown, the 8-bit digital samples are read out from memory 506 at a rate of 250 MSa/s. Data outputs 532 and output sub-busses 508-1 through 508-8 collectively deliver the digital samples to output buffer 580 at a rate of 250 MSa/s, and output port sub-busses 556-1 and 556-2 collectively deliver the digital samples to the output port at a rate of 250 MSa/s. The rates at which the digital samples are read out from memory 506 and delivered to the output port is substantially less than (1/80) the 20 GSa/s sampling rate of ADC 502.

Operation of analog-to-digital conversion system 500 will now be described. Each of the analog-to-digital converter modules 502-1 through 502-80 receives the analog input signal via its analog input 520. Each analog-to-digital converter module operates in response to a phase of the multi-phase clock signal received via clock input 524 to generate digital samples of the analog input signal at a sampling rate of 1/80 of the 20 GSa/s sampling rate of ADC 502. The phases of the multi-phase clock signal fed to the analog-to-digital converter modules differ by π/80 radians. The digital samples generated by the analog-to-digital converter modules receiving adjacent phases of the multi-phase clock signal differ in time by 50 picoseconds. Each analog-to-digital converter module outputs the digital samples at its digital output 522.

ADC sub-busses 570-1 through 570-80 receive the 8-bit digital samples generated by ADC modules 502-1 through 502-80, respectively. Sets of ten adjacent ones of the ADC sub-busses combine to form input sub-busses 504-1 through 504-8. Each of the input sub-busses conveys sets of ten digital samples (80 bits) to the 80-bit data input 530 of a respective one of memory modules 506-1 through 506-8. The write clock input 534 of each of the memory modules 506-1 through 506-8 receives a write clock signal WC from one of the ADC modules connected to it. The memory modules additionally receive the read clock signal RC via their read clock inputs 536.

When write enable signal WE is enabled, each of memory modules 506-1 through 506-8 operates in response to its respective write clock signal WC to write the sets of ten digital samples present at its data input 530 into the memory module. For example, each memory module may store the sets of ten digital samples consecutively received at its data input in memory locations having consecutive addresses.

Storage of the sets of ten digital samples received via input sub-busses 504-1 through 504-8 in memory modules 506-1 through 506-8, respectively, continues while the write enable signal WE is asserted. As described above, in one operational mode, storage of the sets of digital samples stops when a desired number of sets of samples, less than the sample set capacity of the memory, has been stored in memory 506 or when the memory is full. In another operational mode, each memory module continuously stores the L most recently received sets of ten digital samples, where L is the sample set capacity of the memory module.

After the sets of digital samples have been stored in memory 506 and write enable signal WE has been de-asserted, the sets of ten digital samples can be read out of the memory. The sets of ten of digital samples are read out from each of memory modules 506-1 through 506-8 in the temporal order in which they were stored. The digital samples are read out from all of the memory modules simultaneously.

Memory modules 506-1 through 506-8 operate in response to read enable signal RE and read clock signal RC and to output the sets of ten digital samples stored therein at their data outputs 532. Output sub-busses 508-1 through 508-8 deliver the sets of ten digital samples in parallel to output buffer 580. In each period of the 6.25 MHz read clock signal, the sub-busses collectively deliver 800 digital samples to the data inputs 582 of the output buffer.

Output buffer 580 operates in response to the 250 MHz master clock signal MC to rearrange the digital samples received in parallel at its data inputs 582 into parallel pairs of digital samples in temporal order. The output buffer outputs the digital samples in each pair at its data outputs 584. The rate at which the pairs of digital samples are output is 125 MHz. Thus, individual digital samples are delivered to the output port at a rate of 250 MHz.

Output port sub-busses 556-1 and 556-2 deliver the pairs of digital samples from the data outputs 586 of output buffer 580 to output port 510. The data rate at which the digital samples are delivered to the output port is substantially less than the sampling rate of ADC 502. The rate at which each stream of the digital samples is delivered to the output port is 125 MHz, a rate at which a digital signal having high signal integrity can easily be delivered at the package pins that constitute part of the output port. This rate is also compatible with the data rate requirements of many types of downstream circuitry.

In the analog-to-digital conversion system 500 just described, an example in which each of memory modules 506-1 through 506-8 is composed of 125 kilobytes of static random-access memory (SRAM) will store an event having a maximum duration of about 50 microseconds. While this is adequate for many applications, it is sometimes desirable to store events having a longer maximum duration without the expense of increasing the size and/or number of the memory devices used as the memory modules. Such longer-duration events may not need the very high temporal resolution provided by the maximum sampling rate of the analog-to-digital conversion systems described above. Analog-to-digital conversion systems are typically designed to operate at a specific sampling rate and making the sampling rate variable is not trivial.

Figure 6:
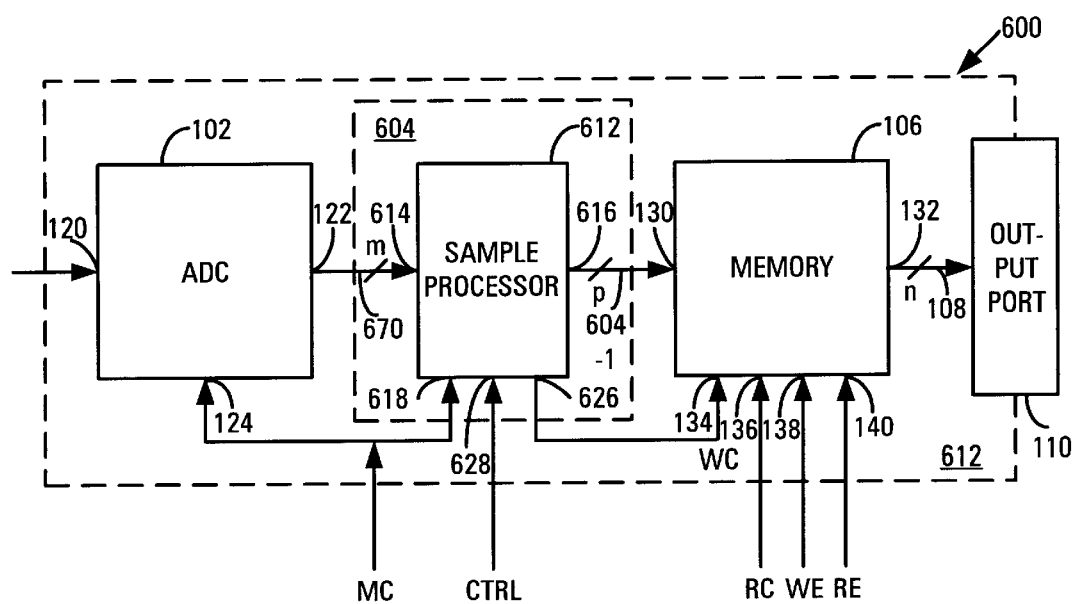
FIG. 6 is a block diagram of a sixth embodiment of an analog-to-digital conversion system according to the invention.

FIG. 6 is a block diagram of a sixth embodiment 600 of an analog-to-digital conversion system according to the invention that provides the option to capture events having a longer duration. The example of the analog-to-digital conversion system 600 shown is based on the analog-to-digital conversion system 100 shown in FIG. 1. It will be apparent that the embodiments of the analog-to-digital conversion system shown in FIGS. 2–5 can be similarly modified. Elements of analog-to-digital conversion system 600 that correspond to the analog-to-digital conversion system described above with reference to FIG. 1 are indicated using the same reference numerals and will not be described again here.

In analog-to-digital conversion system 600, input data bus 604 is composed of ADC sub-bus 670, sample processor 612 and input sub-bus 604-1. The sample processor includes a sample input 614, a sample output 616, a clock input 618, a clock output 626 and a control input 628. ADC 102, input data bus 604 including sample processor 612, memory 106, output data bus 108 and part of output port 110 constitute at least part of a chip 612.

ADC sub-bus 670 extends from the digital output 122 of ADC 102 to the sample input 614 of sample processor 612 and is composed of m conductors. Input sub-bus 604-1 extends from the sample output 616 of the sample processor to the data input 130 of memory 106 and is composed of p conductors. Typically, p=m. However, the sample processor may additionally operate to combine sets of q m-bit digital samples into respective p-bit digital sample sets for output to the memory. In this case, p=qm.

Master clock signal MC is additionally connected to the clock input 618 of sample processor 612. Clock output 626 is connected to the write clock input 134 of memory 106. Control input is 628 is connected to receive a control signal CTRL.

The conductors constituting ADC sub-bus 670 and input sub-bus 604-1 are short in length and extend directly across a surface of chip 612 from the digital output 122 of ADC 102 to the sample input 614 of sample processor 612 and from the sample output 616 of the sample processor to the data input 130 of memory 106. The sample processor is structured to operate at the highest sampling rate supported by the ADC. Accordingly, the ADC sub-bus, the sample processor and the input sub-bus are all capable of operating at the highest sampling rate supported by the ADC.

Sample processor 612 operates on the digital samples received from ADC 102 to reduce the rate at which digital samples are conveyed to memory 106, thereby increasing the maximum duration of an event that can be stored in the memory. The sample processor can reduce the rate at which the digital samples are conveyed to the memory in a number of different ways. The sample processor is structured to be switchable by control signal CTRL between a first state in which it conveys the digital samples to the memory at a rate equal to the sampling rate of ADC 102 and a second state in which it conveys digital samples to the memory at a reduced rate. The sample processor may be structured to be additionally switchable by the control signal to states in which it conveys digital samples to the memory at respective different reduced rates. Finally, sample processor may structured to be additionally switchable by the control signal to states in which it processes the digital samples received from the ADC in respective different ways prior to conveying the digital samples to the memory at a given reduced rate.

In the example shown, sample processor 612 is additionally structured to provide write clock signal WC to memory 106 via clock output 626. The write clock signal has a frequency corresponding to the rate at which the sample processor conveys the digital samples to the memory. Depending on the structure of memory 106, the write clock signal may be a single-phase clock signal or a multi-phase clock signal.

In a first example of the operation of sample processor 612, analog-to-digital conversion system 600 has its maximum temporal resolution and the sample processor conveys every digital sample it receives from ADC 102 via ADC sub-bus 670 to memory 106 via input sub-bus 604-1.

In a second example of the operation of sample processor 612, the sample processor increases the maximum duration of an event that can be stored in memory 106 by conveying to the memory only selected ones of the digital samples it receives from ADC 102. For example, the sample processor can double the maximum duration of an event that can be stored in the memory by conveying to the memory alternate ones of the digital samples received from the ADC. The maximum duration can be tripled, quadrupled, etc. by the sample processor conveying to the memory only one-in-three, one-of-four, etc., of the digital samples it receives from the ADC. Alternatively, the sample processor can increase the maximum duration by a fractional amount by conveying to the memory only r of every s digital samples it receives from the ADC, where $1 < r < s$.

In a third example of the operation of sample processor 612, the sample processor increases the maximum duration of an event that can be stored in memory 106 by performing arithmetic operations on the digital samples in each block of S digital samples it receives from ADC 102. The arithmetic operations calculate one or more calculated digital samples, such as a mean value, an average value, an RMS value, a median value, a maximum value, a minimum value or another value of the digital samples in the block. The sample processor then conveys one of, selected ones of, or all of the calculated digital samples to the memory instead of all the digital samples in the block.

In the third example described above, the increase in the maximum duration of an event that can be stored in memory 106 depends on the number S of digital samples in each block and depends inversely on the number of digital samples conveyed to the memory instead of all the digital samples in the block. The choice of the digital samples calculated for conveying to the memory instead of all the digital samples in the block depends in part on the measurement to be performed using the digital samples. In an example in which the maximum value and minimum value of the analog input signal are to be measured, digital samples respectively having the maximum value and the minimum value of the digital samples in the block are calculated and are conveyed to the memory instead of all of the digital samples in the block.

In a practical embodiment of analog-to-digital conversion system 600, sample processor 612 was implemented using a digital signal processor. The sample processor may be implemented in other types of programmable or non-programmable circuit capable of operating at the sampling rate of ADC 102.

Figure 7A:
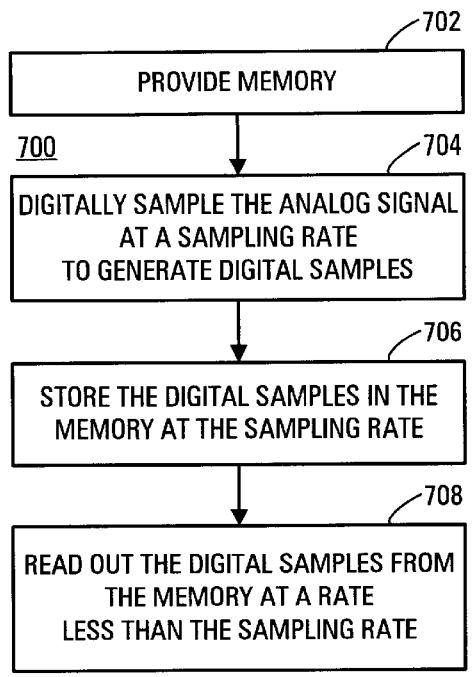
FIG. 7A is a flow chart illustrating a first embodiment of a method according to the invention for digitally sampling an analog input signal.

FIG. 7A is a flow chart illustrating a first embodiment 700 of a method according to the invention for digitally sampling an analog input signal.

In block 702, memory is provided.

In block 704, the analog input signal is digitally sampled at a sampling rate to generate digital samples.

In block 706, the digital samples are stored in the memory at the sampling rate.

In block 708, the digital samples are read out from the memory at a rate less than the sampling rate.

FIGS. 7B–7H are flow charts illustrating additional embodiments of the method according to the invention. The additional embodiments are variations on the first embodiment shown in FIG. 7A.

Figure 7B:
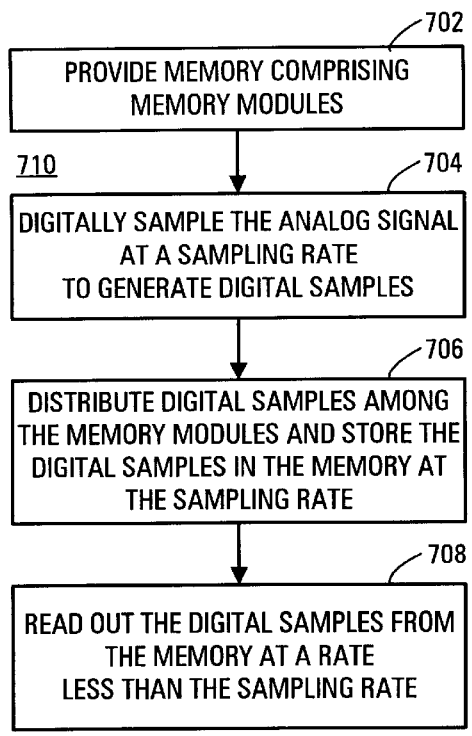
FIGS. 7B–7H are flow charts illustrating additional embodiments that are variations on the method illustrated in FIG. 7A.

FIG. 7B shows a second embodiment 710 of the method. In block 702, the memory is composed of memory modules. In block 706, the digital samples are distributed among the memory modules prior to storage. This allows memory devices that operate more slowly than the sampling rate to be used collectively to store the digital samples generated at the sampling rate.

Figure 7C:
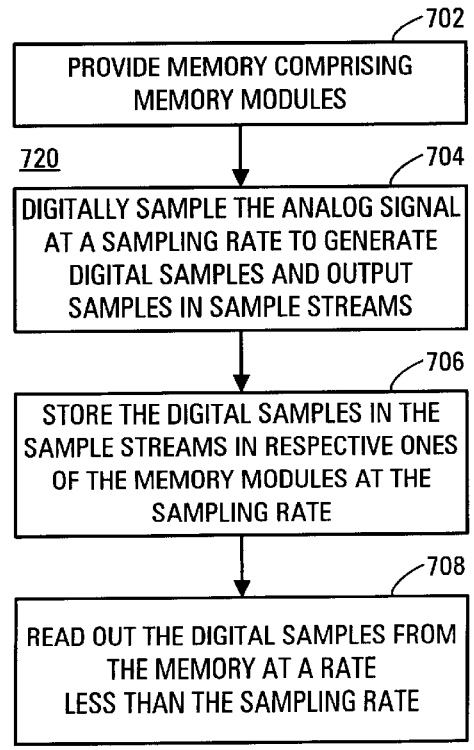

FIG. 7C shows a third embodiment 720 of the method. In block 702, the memory is composed of memory modules. In block 704, the digital samples are output in sample streams having a collective rate equal to the sampling rate. Then, in block 706, the digital samples in each of the sample streams are stored in a respective one of the memory modules.

Figure 7D:
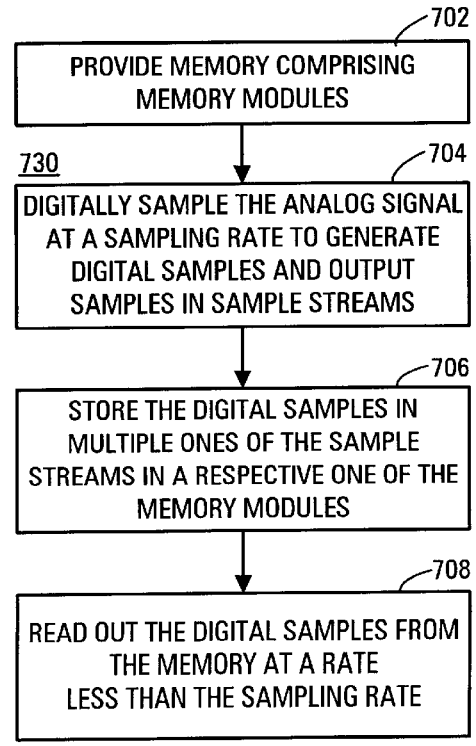

FIG. 7D shows a fourth embodiment 730 of the method. In block 702, the memory is composed of memory modules. In block 704, the digital samples are output in sample streams having a collective rate equal to the sampling rate. Then, in block 706, the digital samples in multiple ones, e.g., two or more, of the sample streams are stored in a respective one of the memory modules.

Figure 7E:
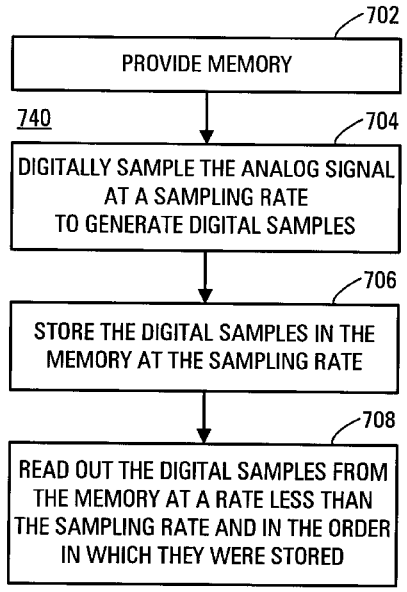

FIG. 7E shows a fifth embodiment 740 of the method. In block 708, the digital samples are read out of the memory in the order in which they were stored in the memory.

Figure 7F:
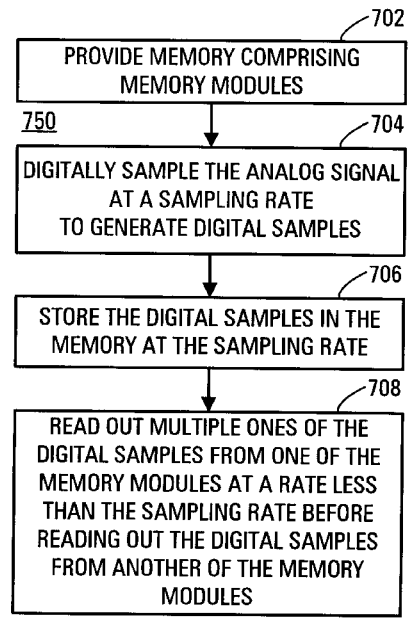

FIG. 7F shows a sixth embodiment 750 of the method. In block 702, the memory is composed of memory modules. In block 708, multiple ones of the digital samples are read out from one of the memory modules before the digital samples are read out from another of the memory modules. The multiple ones of the digital samples read out can range from a subset of the digital samples stored in the memory module to all of the digital samples stored in the memory module.

Figure 7G:
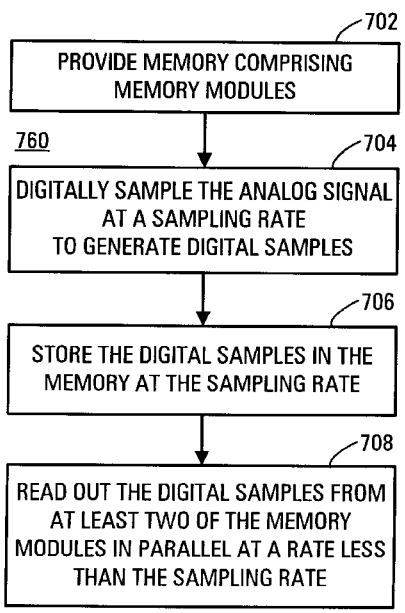

FIG. 7G shows a seventh embodiment 760 of the method. In block 702, the memory is composed of memory modules. In block 708, the digital samples are read out from at least two of the memory modules in parallel.

Figure 7H:
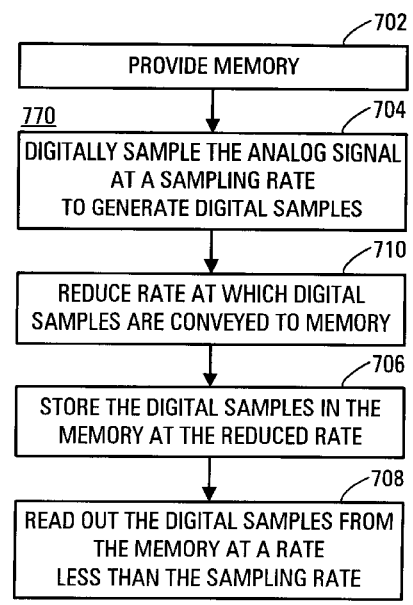

FIG. 7H shows an eighth embodiment 770 of the method. In block 710, the rate at which the digital samples are conveyed to the memory is reduced relative to the sampling rate. Then, in block 706, the digital samples are stored in the memory at the reduced rate. The rate at which digital samples are conveyed to the memory may be reduced by conveying selected ones of the digital samples generated by the digital sampling to the memory instead of all of the digital samples generated by the digital sampling. Additionally or alternatively, the rate at which digital samples are conveyed to the memory may be reduced by calculating calculated digital samples from the digital samples generated by the digital sampling and delivering the calculated digital samples to the memory instead of all of the digital samples generated by the digital sampling.

Although this disclosure describes illustrative embodiments of the invention in detail, it is to be understood that the invention is not limited to the precise embodiments described, and that various modifications may be practiced within the scope of the invention defined by the appended claims.

We claim:

1. An analog-to-digital conversion system, comprising:
an analog-to-digital converter including a digital output, the analog-to-digital converter structured to generate digital samples at a sampling rate;

memory having a data input and a data output;

an output port;

an input data bus extending from the digital output of the analog-to-digital converter to the data input of the memory and structured to operate at the sampling rate; and an output data bus extending from the data output of the memory to the output port;

wherein at least one of the data output of the memory, the output data bus and the output port is structured to operate at a maximum rate less than the sampling rate.

2. The analog-to-digital conversion system of claim 1, in which:

the memory includes memory modules, each of the memory modules having a data input and a data output; and the input data bus extends from the digital output of the analog-to-digital converter to the data input of each of the memory modules.

3. The analog-to-digital conversion system of claim 2, in which the input data bus includes:

at least one ADC sub-bus extending from the digital output of the analog-to-digital converter; and input sub-busses fanning out to the data inputs of ones of the memory modules from the at least one ADC sub-bus.

4. The analog-to-digital conversion system of claim 2, in which the output data bus includes output sub-busses extending from the data outputs of ones of the memory modules.

5. The analog-to-digital conversion system of claim 4, in which each of the output sub-busses extends to the output port.

6. The analog-to-digital conversion system of claim 4, in which:

the output data bus additionally includes at least one output port sub-bus extending to the output port; and ones of the output sub-busses fan into the at least one output port sub-bus.

7. The analog-to-digital conversion system of claim 4, in which the output data bus additionally includes:

at least one output port sub-bus extending to the output port; and a data selector interposed between the at least one output port sub-bus and the output sub-busses.

8. The analog-to-digital conversion system of claim 2, in which:

the analog-to-digital converter includes analog-to-digital converter modules each having a digital output; and the input data bus extends from the digital outputs of the analog-to-digital converter modules to the data inputs of the memory modules.

9. The analog-to-digital conversion system of claim 8, in which the input data bus includes input sub-busses extending from the digital outputs of the analog-to-digital converter modules to the data inputs of the memory modules.

10. The analog-to-digital conversion system of claim 8, in which:

the memory modules are fewer in number than the analog-to-digital converter modules; and the input data bus includes:

ADC sub-busses extending from the digital outputs of the ADC modules, and input sub-busses extending to the data inputs of the memory modules, more than one of the ADC sub-busses being combined into each of the input sub-busses, the input sub-busses having a width equal to the sum of the widths of the ADC sub-busses combined thereinto.

11. The analog-to-digital conversion system of claim 8, in which the output data bus extends from the outputs of the memory modules to the output port.

12. The analog-to-digital conversion system of claim 1, in which:

the analog-to-digital converter includes analog-to-digital converter modules each having a digital output;

the input data bus extends from the digital outputs of the analog-to-digital converter modules to the memory.

13. The analog-to-digital conversion system of claim 1, in which:

the memory includes memory modules, each having a data input and a data output; and the output data bus extends from the outputs of the memory modules to the output port.

14. The analog-to-digital conversion system of claim 1, in which the input data bus includes a sample processor connected to receive the digital samples from the analog-to-digital converter at the sampling rate and structured to reduce the rate at which digital samples are conveyed to the memory.

15. A method of digitally sampling an analog input signal, the method comprising:

providing memory;

digitally sampling the analog input signal at a sampling rate to generate digital samples;

storing the digital samples in the memory at the sampling rate; and reading out the digital samples from the memory at a rate less than the sampling rate.

16. The method of claim 15, in which, in providing memory, memory comprising memory modules is provided.

17. The method of claim 16, in which storing the digital samples includes distributing the digital samples among the memory modules prior to the storing.

18. The method of claim 16, in which:

digitally sampling the analog input signal includes outputting the digital samples in sample streams, the sample streams collectively having a rate equal to the sampling rate; and storing the digital samples includes storing the digital samples in each of the sample streams in a respective one of the memory modules.

19. The method of claim 16, in which:

digitally sampling the analog input signal includes outputting the digital samples in sample streams, the sample streams collectively having a rate equal to the sampling rate; and storing the digital samples includes storing the digital samples in multiple ones of the sample streams in a respective one of the memory modules.

20. The method of claim 16, in which reading out the digital samples from the memory includes reading out multiple ones of the digital samples from one of the memory modules before reading out the digital samples from another of the memory modules.

21. The method of claim 16, in which reading out the digital samples from the memory includes reading out the digital samples from at least two of the memory modules in parallel.

22. The method of claim 16, in which reading out the digital samples from the memory includes reading out the digital samples from the memory in the order in which they were stored.

23. The method of claim 16, in which:
   the method additionally comprises reducing the rate at which digital samples are conveyed to the memory relative to the sampling rate; and
   in storing the digital samples in the memory, the digital samples are stored in the memory at the reduced rate.

24. The method of claim 23, in which reducing the rate at which digital samples are conveyed to the memory includes conveying selected ones of the digital samples generated by the digital sampling to the memory instead of all of the digital samples generated by the digital sampling.

25. The method of claim 23, in which reducing the rate at which digital samples are conveyed to the memory includes:
   calculating calculated digital samples from the digital samples generated by the digital sampling; and
   conveying the calculated digital samples to the memory instead of all of the digital samples generated by the digital sampling.

* * * * *